(12) United States Patent
Fleming et al.

(10) Patent No.: US 11,378,622 B1
(45) Date of Patent: Jul. 5, 2022

(54) METHODS AND SYSTEMS FOR SINGLE-EVENT UPSET FAULT INJECTION TESTING

(71) Applicant: Raytheon Company, Waltham, MA (US)

(72) Inventors: Patrick Fleming, El Segundo, CA (US); Mustafa Amin, El Segundo, CA (US); James Bynes, III, El Segundo, CA (US); Patrick Llorens, El Segundo, CA (US); Dale D. Kachuche, El Segundo, CA (US); Brian Clebowicz, El Segundo, CA (US); William Rowe, El Segundo, CA (US); Alfredo Lara, El Segundo, CA (US); Neal Pollack, El Segundo, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/141,872

(22) Filed: Jan. 5, 2021

(51) Int. Cl.
*G01R 31/3185* (2006.01)
*G06F 11/22* (2006.01)
(Continued)

(52) U.S. Cl.
CPC ........... *G01R 31/318519* (2013.01); *G01R 31/31701* (2013.01); *G01R 31/31703* (2013.01);
(Continued)

(58) Field of Classification Search
CPC .... G01R 31/318519; G01R 31/318516; G01R 31/31701; G01R 31/31703;
(Continued)

(56) References Cited

U.S. PATENT DOCUMENTS

| 7,409,610 B1* | 8/2008 | Drimer | G01R 31/318544 |
| | | | 326/39 |
| 2007/0050740 A1* | 3/2007 | Jacobi | G06F 30/3323 |
| | | | 716/103 |

(Continued)

FOREIGN PATENT DOCUMENTS

CN          106124970 B      11/2018

OTHER PUBLICATIONS

Y. Xie, H. Chen, Y. Xie, C. Mao and B. Li, "An Automated FPGA-Based Fault Injection Platform for Granularly-Pipelined Fault Tolerant CORDIC," 2018 International Conference on Field-Programmable Technology (FPT), Naha, Japan, 2018, pp. 370-373. (Year: 2018).*

(Continued)

*Primary Examiner* — Cynthia Britt
(74) *Attorney, Agent, or Firm* — Burns & Levinson LLP; Joseph M. Maraia

(57) ABSTRACT

Fault injection testing for field programmable gate array (FPGA) devices including: interfacing with a FPGA device under test (DUT); imaging a configuration RAM (CRAM) of the FPGA DUT with a first configuration image to define a first operational function of the FPGA DUT where the CRAM includes a plurality of CRAM bits, injecting a plurality of single event upsets into a portion of the plurality of the CRAM bits while the FPGA DUT is operating; concurrently monitoring operations of the FPGA DUT and a reference FPGA device; comparing outputs of the FPGA DUT with outputs of the reference FPGA device during concurrent operations, and if there is a mismatch between the outputs of the FPGA DUT and the reference FPGA, determining that error events have occurred within the FPGA DUT; and storing the error events and CRAM loca- (Continued)

tion data associated with corresponding single event upsets in an error log.

20 Claims, 5 Drawing Sheets

(51) Int. Cl.
G06F 11/273 (2006.01)
G01R 31/3183 (2006.01)
G01R 31/3181 (2006.01)
G01R 31/317 (2006.01)

(52) U.S. Cl.
CPC ........ *G01R 31/31816* (2013.01); *G01R 31/318385* (2013.01); *G06F 11/2268* (2013.01); *G06F 11/273* (2013.01)

(58) Field of Classification Search
CPC ...... G01R 31/31816; G01R 31/318385; G06F 11/2268; G06F 11/273
See application file for complete search history.

(56) References Cited

U.S. PATENT DOCUMENTS

| | | | | |
|---|---|---|---|---|
| 2008/0040694 A1* | 2/2008 | Acuna | ................ | G06F 30/30 716/103 |
| 2012/0144244 A1* | 6/2012 | Dan | ................ | G11C 29/56 714/39 |
| 2012/0317533 A1* | 12/2012 | Zawalski | ................ | G06F 30/331 716/136 |
| 2013/0305199 A1* | 11/2013 | He | ................ | G06F 30/34 716/104 |
| 2016/0335145 A1* | 11/2016 | Toba | ................ | G06F 11/0754 |

OTHER PUBLICATIONS

Z. Jing et al., "Study of an Automated Precise SEU Fault Injection Technique," 2012 IEEE 26th International Parallel and Distributed Processing Symposium Workshops & PhD Forum, Shanghai, China, 2012, pp. 277-281. (Year: 2012).*

R. Zhang, L. Xiao, J. Li, X. Cao, C. Qi and M. Wang, "A fast fault injection platform of multiple SEUs for SRAM-based FPGAs," 2017 Prognostics and System Health Management Conference (PHM-Harbin), Harbin, China, 2017, pp. 1-5. (Year: 2017).*

Thurlow, C., et al., "TURTLE: A Low-Cost Fault Injection Platform for SRAM-based FPGAs," Intl. Conf. on ReConFigurable Comp. and FPGAs, Dec. 2019.

Alderighi, M., et al., "Experimental Validation of Fault Injection Analyses by the FLIPPER Tool," IEEE Trans. Nuc. Sci., 2010, 57(4):2129-2134.

Soft Error Mitigation (SEM) Core, Xilinx Product Guide PG036 v4.1, 2018.

Benevenuti, et al., "Comparing Exhaustive and Random Fault Injection Methods for Cofiguration Memory on SRAM-Based FPGAs," 2019 IEEE Latin American Test Symposium (LATS), IEEE, Mar. 11, 2019 (Mar. 11, 2019), pp. 1-6, XP033544596, DOI: 10.1109/LATW.2019.8704647.

Keller, et al., "Benefits of Complementary SEU Mitigation for the LEON3 Soft Processor on SRAM-Based FPGAs," IEEE Transactions on Nuclear Science, IEEE, USA, vol. 64, No. 1, Jan. 1, 2017 (Jan. 1, 2017), pp. 519-528, XP011642174, ISSN: 018-9499, DOI: 10.1109/TNS.2016.2635028.

* cited by examiner

| Step No. | SEU test step description | Fault injection | Heavy Ion |
|---|---|---|---|
| 1 | HW Setup | | Same |
| 2 | Re-image DUT FPGA | | Same |
| 3 | Initiate function test | | Same |
| 4 | Initiate scrubbing | | Same |
| 5 | Initiate error logging | | Same |
| 6 | Inject errors | - Write erroneous values to random CRAM bits<br>- Fixed flux<br>- CRAM only source of upsets | - Turn on particle beam<br>- Variable flux<br>- All primitives potential source of upsets |
| 7 | Stop error injection | - After predetermined fluence<br>- Both test methods generate similar amount of data | Same |
| 8 | Stop error logging | | Same |
| 9 | Stop scrubbing | | Same |
| 10 | Repeat, GOTO Step 2 | | Same |

FIG. 4

METHODS AND SYSTEMS FOR SINGLE-EVENT UPSET FAULT INJECTION TESTING

GOVERNMENT LICENSE RIGHTS

This invention was made with government support with contract information withheld. The government has certain rights in the invention.

TECHNICAL FIELD

This application relates generally to testing electronic equipment and, more particularly, to testing electronic integrated circuits for radiation hardness assurance.

BACKGROUND

Aerospace vehicles, among other types of vehicles, house electronic systems including integrated circuits (ICs) that can perform various operations such as providing navigational control, power, communications, payload monitoring, and data collection. These vehicles, and their electronic systems, are often subjected to extreme environmental stresses including ionizing radiation.

An IC may be configured as application specific integrated circuit (ASIC). One type of ASIC is a field programmable gate array (FPGA) device or chip. A FPGA provides field programmable processing circuitry that enables more rapid development and deployment of application-specific processing functions within electronic equipment. FPGAs typically use sets of look-up tables (LUTs) that are configurable using configuration random access memory (CRAM). CRAM typically uses static RAM (SRAM) that includes configuration information used to configure and route multiple LUTs within an FPGA to realize one or more application-specific processing functions of the FPGA chip. SRAM typically uses latching circuitry called a memory cell to store each bit of information. CRAM may be arranged as distributed RAM, shift-registers, LUTs and are used for routing in an IC. A FPGA chip includes a programming interface to enable a programmer to read the FPGA configuration and configure the processing functions of the FPGA by setting the CRAM information which, in turn, configures one or more LUTs of the FPGA chip. Hardware description language (HDL) or Very High Speed Integrated Circuit Hardware description language (VHDL) are commonly used FPGA programming languages. Each information bit within CRAM is typically stored as a logical 1 or 0 depending on the state of a corresponding SRAM latching circuit or memory cell element.

Unfortunately, electronic circuitry including FPGA chips operating in space have proven to be susceptible to adverse effects from ionizing radiation. With respect to FPGAs, ionizing radiation that impacts elements of the FPGA chip's architecture can transfer energy to elements such as CRAM memory elements, resulting in energy transfers that change the electrical state of the memory cell elements or latching circuitry and their corresponding logical states. Such changes of state among one or more CRAM memory elements can result in changes in the intended configuration of the CRAM and, thereby, result in changes to configurations of FPGA LUTs which ultimately changes or degrades processing functions of an FPGA chip. Existing FPGAs typically implement triple modular redundancy (TMR) and scrubbing techniques to mitigate adverse effects of ionizing radiation in space.

To provide an assurance that certain ICs such as FPGA devices or chips can operate robustly while exposed to ionizing radiation in space, FPGA chips are typically subjected to a beam test that requires a continuous series of expensive particle accelerator test runs, each requiring months of preparation and a high cost for each test. This beam test approach only indicates upset events with no ability to correlate the upset events to impact locations or specific elements within a tested FPGA chip. Furthermore, the beam test approach yields noisy data due to variable beam effects, which makes analysis of the test results, such a being able to specifically identify defective circuitry of a FPGA, extremely difficult.

As an alternative testing approach, fault injection testing (FIT) has been attempted, but has either: failed, been limited to bare-bones proof-of-concept efforts not reduced to practical application, or required extensive embedded test circuitry that impacts FPGA performance and resource use.

Thus, there is a need for more rapid, more efficient, more granular, and less costly assurance testing of integrated circuits such as FPGAs that are expected to withstand adverse effects of ionizing radiation in space. Furthermore, there is a need for more deterministic and reliable assurance testing that reduces over-design of fault tolerant circuits, freeing up FPGA resources for more functionality while reducing FPGA circuit complexity and costs.

SUMMARY

The application, in various implementations, addresses deficiencies associated with testing the fault tolerance of electronic circuits including FPGA devices and/or chips subject to ionizing radiation in space.

This application describes exemplary fault injection testing (FIT) tools and methods for quickly, accurately, and inexpensively simulating radiation induced upsets in RAM based FPGA designs that normally requires many lengthy, risky, and expensive particle accelerator beam tests to evaluate. The inventive techniques described herein include the first practical FPGA design tool proven to accurately and rapidly simulate upset effects.

FIT, as described in the systems and methods herein, includes a design simulation tool, enabling FPGA development teams to determine the upset performance of their designs in days rather than months, and to pinpoint problem areas immediately. FIT was previously a concept not practically realized in industrial applications. The inventors have raised existing FIT techniques from a concept to a practical industrial design tool. FIT can be performed locally, in hours to days at any level of design with high visibility into cause and effect, eliminating test risks and reducing program schedule and cost risk.

The FIT systems and methods described herein for single event upset (SEU) rate measurement differ from conventional beam testing in the source of upsets. Upsets are logically injected into FPGA configuration memory rather than caused by particle impacts. Absolute control of flux in the fault injection systems and methods described herein allow for much more accurate testing than with particle beams. Once a test is set up (e.g. in about 1 day), it may take no more than 12 hours to run as opposed to taking about three months for setup and execution using beam testing. The systems and/or methods described herein for SEU rate measurement may be implemented on flight hardware and/or flight firmware without destroying it or making it unusable due to de-lidding for testing or due to residual radioactivity. The inventive FIT techniques described herein may use hardware, firmware, and/or software test interfaces to implement logical fault injection methods, implement an upset measurement methodology, and/or implement cause and effect impact assessment methods.

In one aspect, a fault injection test system for FPGA devices includes a test interface module having a first communications interface for a FPGA device under test (DUT) and a second communications interface for a reference FPGA device. The test interface module may be arranged to: image a configuration RAM (CRAM) of the FPGA DUT, via the first communications interface, with a first configuration image to implement a first operational function in the FPGA DUT, the CRAM including a plurality of CRAM bits; image a CRAM of the reference FPGA device, via the second communications interface, with the first configuration image to implement the first operational function in the reference FPGA device, and log error event data associated with one or more error events stored in one or more error registers.

The system also includes a configuration module having at least a communications interface to the FPGA DUT, where the configuration module is arranged to inject a plurality of single event upsets into a portion of the plurality of the CRAM bits while the FPGA DUT is operating based on the operational function. The system further includes a monitor module having at least a communications interface for the FPGA DUT and in communications with the reference FPGA device. The monitor module includes the one or more error registers and is arranged to: monitor operations of the FPGA DUT and the reference FPGA device while the FPGA DUT and the reference FPGA devices are operating concurrently; compare one or more outputs of the FPGA DUT with one or more outputs of the reference FPGA device during concurrent operations; and if there is a mismatch between the one or more outputs of the FPGA DUT and the one or more outputs of the reference FPGA, determine that the one or more error events have occurred within the FPGA DUT and store the one or more error events in the one or more error registers.

The configuration module, which is in communications with the test module and the monitor module, may be further arranged to: instruct the test interface module to image the FPGA DUT and reference FPGA device and initiate concurrent operations of the FPGA DUT and the reference FPGA device; instruct the monitor module to monitor the concurrent operations of the FPGA DUT and the reference FPGA device while the configuration module injects the plurality of single event upsets into the portion of the plurality of CRAM bits of the FPGA DUT, and store the error event data associated with the one or more error events in an error log.

The configuration module may randomly select the portion of the plurality of the CRAM bits. The configuration module may select the portion of the plurality of the CRAM bits based on an error log from a previous fault injection test of the FPGA DUT. The configuration module may select the portion of the plurality of the CRAM bits based on one or more memory addresses of the CRAM bits associated with error events in the error log of the previous fault injection test of the FPGA DUT.

In one implementation, injecting a single event upset of the plurality of single event upsets includes changing a logical state of a CRAM bit from a logical 1 to a logical 0 or from a logical 0 to a logical 1. A change in logical state of a CRAM bit corresponds to a change in an electrical state of a CRAM memory element. The error event data may include one or more memory locations of where single event upsets were injected into CRAM. The error log may be stored in a database located in the monitor module and/or the configuration module. The configuration module may instruct the test interface module to re-image the CRAM of the FPGA DUT with a second configuration image that implements the first operational function of the FPGA DUT based on the error log where the second configuration image implements the first operational function of the FPGA DUT while increasing a fault tolerance of the FPGA DUT.

In another aspect, a method for performing fault injection testing for FPGA devices includes: interfacing, via a first communications interface, with a FPGA DUT; imaging a configuration RAM (CRAM) of the FPGA DUT with a first configuration image to define a first operational function of the FPGA DUT where the CRAM includes a plurality of CRAM bits; injecting a plurality of single event upsets into a portion of the plurality of the CRAM bits while the FPGA DUT is operating based on the operational function; monitoring, via a second communications interface, operations of the FPGA DUT; monitoring concurrently with monitoring the operations of the FPGA DUT, via a third communications interface, operations of a reference FPGA device, wherein a CRAM of the reference FPGA device is configured with the first configuration image and operating based on the first operational function; comparing one or more outputs of the FPGA DUT with one or more outputs of the reference FPGA device during concurrent operations; if there is a mismatch between the one or more outputs of the FPGA DUT and the one or more outputs of the reference FPGA, determining that one or more error events have occurred within the FPGA DUT; and storing at least one of the one or more error events and CRAM location data associated with corresponding single event upsets in an error log.

In one implementation, the method includes randomly selecting the portion of the plurality of the CRAM bits. The method may include selecting the portion of the plurality of the CRAM bits based on an error log from a previous fault injection test of the FPGA DUT. The method may include injecting the selected plurality of single event upsets into the portion of the plurality of CRAM bits of the FPGA DUT while the FPGA DUT is operating. Injecting a single event upset of the plurality of single event upsets includes changing a logical state of a CRAM bit from a logical 1 to a logical 0 or from a logical 0 to a logical 1. A change in logical state of a CRAM bit corresponds to a change in an electrical state of a CRAM memory element. The method may include re-imaging the CRAM of the FPGA DUT with a second configuration image that implements the first operational function of the FPGA DUT based on the error log, where the second configuration image implements the first operational function of the FPGA DUT while increasing a fault tolerance of the FPGA DUT.

In a further aspect, a method for performing fault injection testing for FPGA devices includes: interfacing with a FPGA DUT; imaging a configuration RAM (CRAM) of the FPGA DUT with a first configuration image to define a first operational function of the FPGA DUT where the CRAM including a plurality of CRAM bits; injecting a first plurality of single event upsets into randomly-selected portions of the plurality of the CRAM bits while the FPGA DUT is operating based on the operational function; monitoring operations of the FPGA DUT; comparing one or more outputs of the FPGA DUT with one or more known reference outputs; if there is a mismatch between the one or more outputs of the FPGA DUT and the one or more known reference outputs, determining that one or more error events have occurred within the FPGA DUT; storing at least one of the one or more error events and CRAM location data associated with corresponding first single event upsets in an error log; and injecting a second plurality of single event upsets into one or more portions of the plurality of the CRAM bits based on the CRAM location data associated with the corresponding first randomly-selected single event upsets in the error log while the FPGA DUT is operating based on the operational function.

Any two or more of the features described in this specification, including in this summary section, may be combined to form implementations not specifically described in this specification. Furthermore, while this specification may refer to examples of systems and methods related to space, the implementations and methods herein equally apply to land, sea, and underwater systems. The implementations herein also apply equally to fixed facilities or systems that may be subject to extreme environmental stresses or conditions.

The details of one or more implementations are set forth in the accompanying drawings and the following description. Other features and advantages will be apparent from the description and drawings, and from the claims.

DESCRIPTION OF THE DRAWINGS

FIG. 4 shows a process table including a comparison of FIT to beam testing; and

Like reference numerals in different figures indicate like elements.

DETAILED DESCRIPTION

The application, in various aspects, addresses deficiencies associated with existing FPGA fault tolerance and/or assurance testing based on, for example, heavy ion beam testing. FIT, as described in the systems and methods herein, includes a design simulation tool, enabling FPGA development teams to determine the upset performance of their designs in days rather than months, and to pinpoint problem areas immediately. In certain implementations, upsets are logically injected into FPGA configuration memory rather than caused by particle impacts. Absolute control of flux in the fault injection systems and methods described herein allow for much more accurate testing than with particle beams. Once a test is set up (e.g. in about 1 day), it may take no more than 12 hours to run as opposed to taking about three months for setup and execution using beam testing. The systems and/or methods described herein for SEU rate measurement may be implemented on flight hardware and/or flight firmware without destroying it or making it unusable due to de-lidding for testing or due to residual radioactivity. The inventive FIT techniques described herein may use hardware, firmware, and/or software test interfaces to implement logical fault injection methods, implement an upset measurement methodology, and/or implement cause and effect impact assessment methods.

Figure 1:
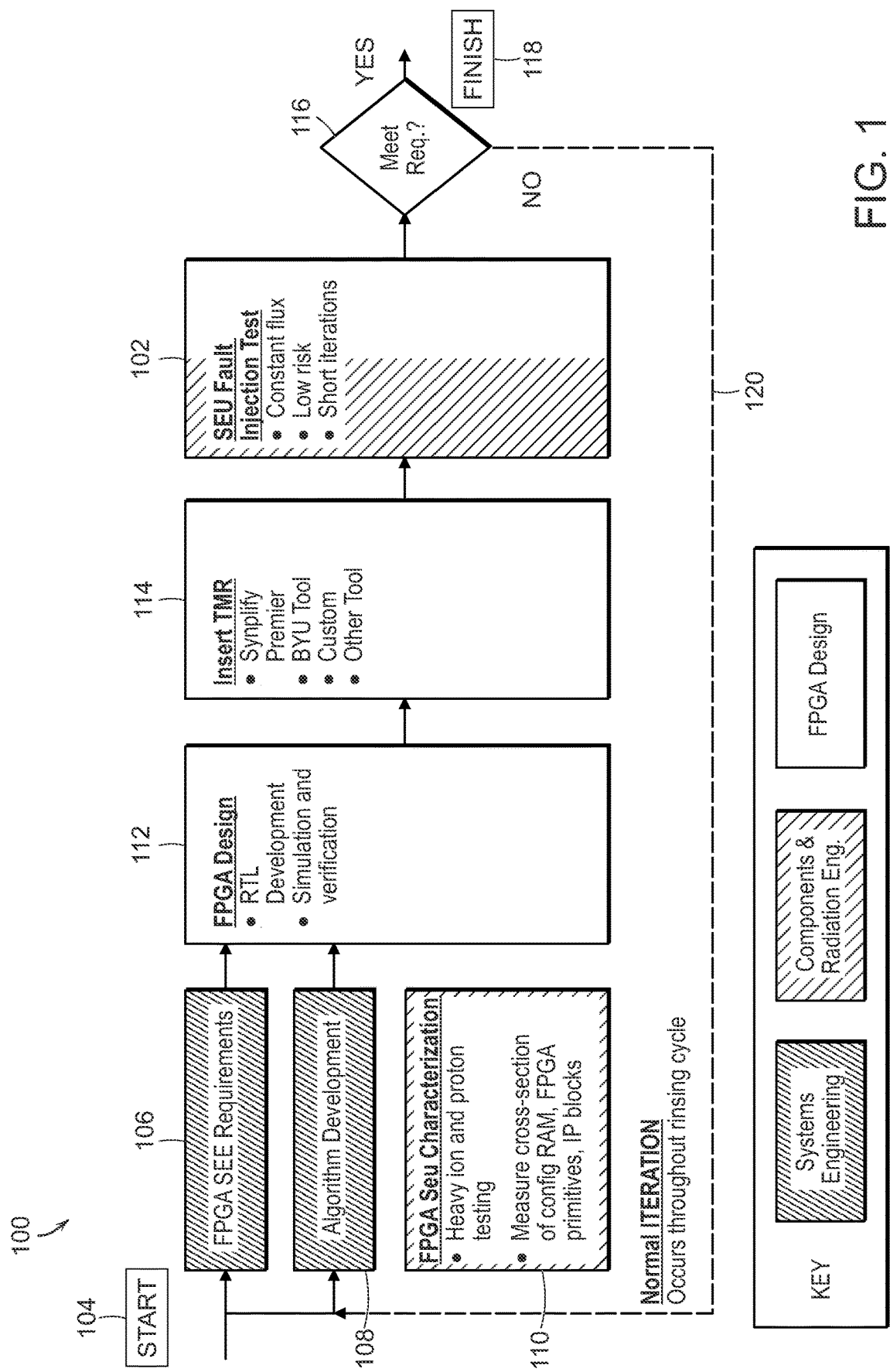
FIG. 1 is a diagram of an exemplary FPGA design process including FIT.

FIG. 1 is a diagram of an exemplary FPGA design process 100 including SEU FIT 102. Process 100 starts (Step 104) with establishing FPGA single event effects (SEE) requirements for an FPGA device (Step 106) and developing the algorithm and/or function to be implemented in the FPGA device (Step 108). FPGA SEU characterization may also be performed (Step 110). The characterization may include heavy ion and proton testing and/or measurements of the cross-section the CRAM of the FPGA, FPGA primitives, and/or IP blocks of the FPGA device. In the next phase, certain aspects of the FPGA device design are performed including register-transfer level (RTL) development and/or circuit simulations and verifications (Step 112). Then TMR may be inserted based on, without limitation, Synplify TMR, single vector TMR, triple vector TMR, a BYU TMR tool, and/or a custom TMR application (Step 114). Then, an SEU fault injection test (FIT) is performed (Step 102). FIT includes a low risk constant flux of SEU injection over short iterations. If the FPGA device meets a threshold requirement of tolerance to SEUs (Step 116), then design of the FPGA device is finished (Step 118). If the FPGA device does not meet the threshold level of assurance and/or fault tolerance (Step 116), then the process is iterated (Step 120) by returning back to the start (Step 104). Iterations may be repeated while TMR is added and/or adjusted before each iteration and until output errors are below an acceptable error level which may less than or equal to 0%, 2%, 5%, 10%, 30%, 40%, or 50%, or higher.

Figure 2:
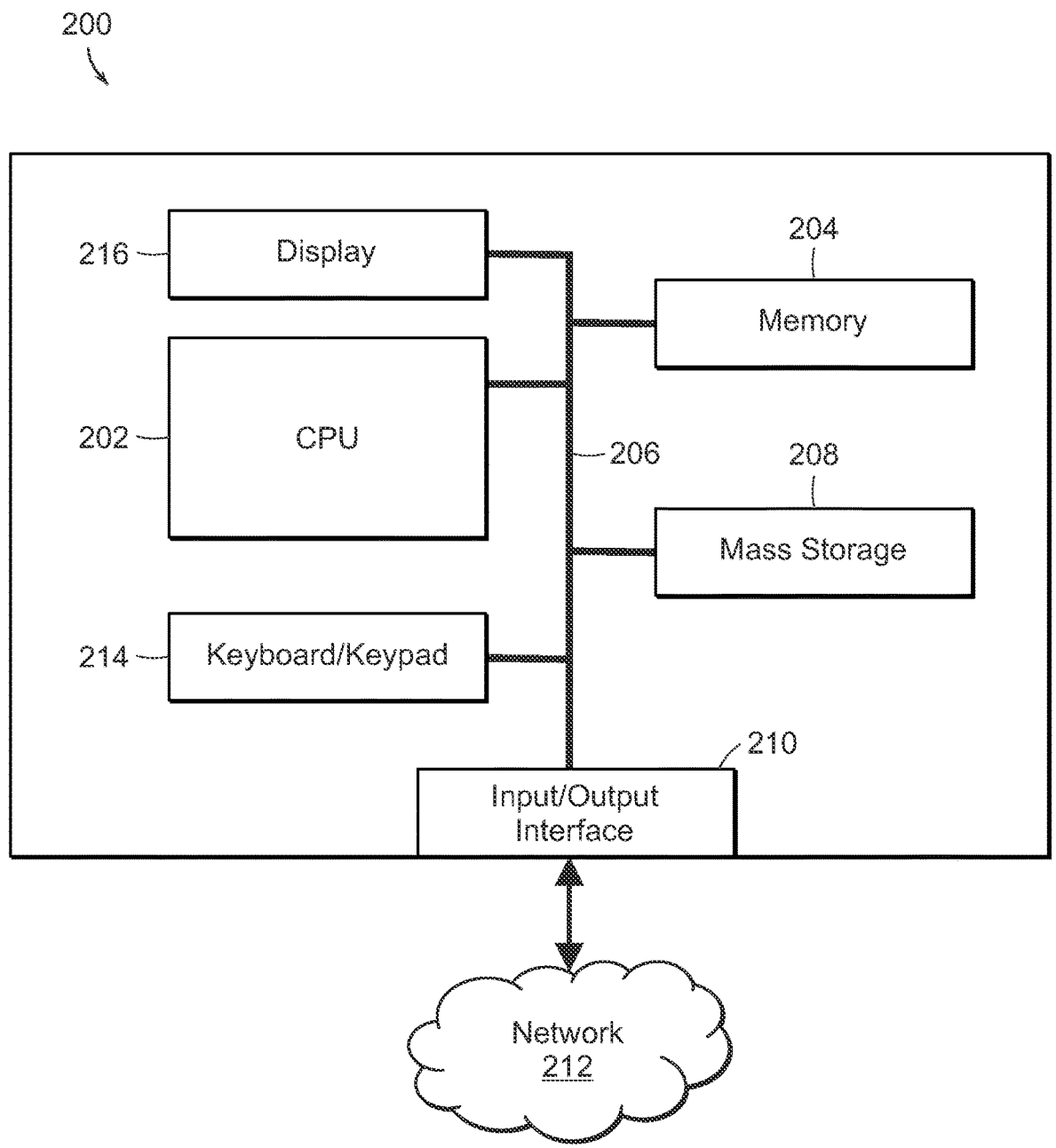
FIG. 2 shows a diagram of a computer system arranged to perform FPGA FIT.

FIG. 2 is block diagram of a computer system 200 arranged to perform processing associated with a FPGA design tool and/or FIT system such as, for example, systems 100 and 300, which are discussed in detail later herein. The exemplary computer system 200 includes a central processing unit (CPU) 202, a memory 204, and an interconnect bus 206. The CPU 202 may include a single microprocessor or a plurality of microprocessors or special purpose processors for configuring computer system 200 as a multi-processor system. The memory 204 illustratively includes a main memory and a read only memory. The computer 200 also includes the mass storage device 208 having, for example, various disk drives, tape drives, etc. The memory 204 also includes dynamic random access memory (DRAM) and high-speed cache memory. In operation, memory 204 stores at least portions of instructions and data for execution by the CPU 202. The memory 204 may also contain compute elements, such as Deep In-Memory Architectures (DIMA), wherein data is sent to memory and a function of the data (e.g., matrix vector multiplication) is read out by the CPU 202.

The mass storage 208 may include one or more magnetic disk, optical disk drives, and/or solid state memories, for storing data and instructions for use by the CPU 202. At least one component of the mass storage system 208, preferably in the form of a non-volatile disk drive, solid state, or tape drive, stores the database used for processing data and controlling functions of an FPGA FIT of systems 100 and/or 300. The mass storage system 208 may also include one or more drives for various portable media, such as a floppy disk, flash drive, a compact disc read only memory (CD-ROM, DVD, CD-RW, and variants), memory stick, or an integrated circuit non-volatile memory adapter (i.e. PC-MCIA adapter) to input and output data and code to and from the computer system 200.

The computer system 200 may also include one or more input/output interfaces for communications, shown by way of example, as interface 210 and/or a transceiver for data communications via the network 212. The data interface 210 may be a modem, an Ethernet card or any other suitable data communications device. To provide the functions of a processor according to FIGS. 1 and 3, the data interface 210 may provide a relatively high-speed link to a network 212, such as an intranet, internet, FPGA testing network, or the Internet, either directly or through another external interface. The communication link to the network 212 may be, for example, optical, wired, or wireless (e.g., via satellite or cellular network). The computer system 200 may also connect via the data interface 210 and network 212 to at least one other computer system to perform remote or distributed FIT. Alternatively, the computer system 200 may include a mainframe or other type of host computer system capable of Web-based communications via the network 212. The computer system 200 may include software for operating a network application such as a web server and/or web client.

The computer system 200 may also include suitable input/output ports, that may interface with a portable data storage device, or use the interconnect bus 206 for interconnection with a local display 216 and keyboard 214 or the like serving as a local user interface for programming and/or data retrieval purposes. The display 216 may include a touch screen capability to enable users to interface with the system 200 by touching portions of the surface of the display 216. Server operations personnel may interact with the system 200 for controlling and/or programming the system from remote terminal devices via the network 212.

The computer system 200 may run a variety of application programs and store associated data in a database of mass storage system 208. One or more such applications may include SEU FIT 102, test interface module 306, configuration module 308, and monitor module 312 such as described with respect to FIGS. 1 and 3. The components contained in the computer system 200 may enable the computer system to be used as a server, workstation, personal computer, network terminal, mobile computing device, mobile telephone, System on a Chip (SoC), and the like. As discussed above, the computer system 200 may include one or more applications such as waveform control, streaming cross-correlations, artifact corrections, target acquisitions, and the tracking and discrimination of targets. The system 200 may include software and/or hardware that implements a web server application. The web server application may include software such as HTML, XML, WML, SGML, PHP (Hypertext Preprocessor), CGI, and like languages.

The foregoing features of the disclosure may be realized as a software component operating in the system 200 where the system 200 includes Unix workstation, a Windows workstation, a LINUX workstation, or other type of workstation. Other operation systems may be employed such as, without limitation, Windows, MAC OS, and LINUX. In some aspects, the software can optionally be implemented as a C language computer program, or a computer program written in any high level language including, without limitation, Javascript, Java, CSS, Python, Keras, TensorFlow, PHP, Ruby, C++, C, Shell, C#, Objective-C, Go, R, TeX, VimL, Perl, Scala, CoffeeScript, Emacs Lisp, Swift, Fortran, or Visual BASIC. Certain script-based programs may be employed such as XML, WML, PHP, and so on. The system 200 may use a digital signal processor (DSP).

As stated previously, the mass storage 208 may include a database. The database may be any suitable database system, including the commercially available Microsoft Access database, and can be a local or distributed database system. A database system may implement Sybase and/or a SQL Server. The database may be supported by any suitable persistent data memory, such as a hard disk drive, RAID system, tape drive system, floppy diskette, or any other suitable system. The system 200 may include a database that is integrated with the system 100 or 300, however, it will be understood that, in other implementations, the database and mass storage 208 can be an external element.

In certain implementations, the system 200 may include an Internet browser program and/or be configured operate as a web server. In some configurations, the client and/or web server may be configured to recognize and interpret various network protocols that may be used by a client or server program. Commonly used protocols include Hypertext Transfer Protocol (HTTP), File Transfer Protocol (FTP), Telnet, and Secure Sockets Layer (SSL), and Transport Layer Security (TLS), for example. However, new protocols and revisions of existing protocols may be frequently introduced. Thus, in order to support a new or revised protocol, a new revision of the server and/or client application may be continuously developed and released.

In one implementation, the system 100 includes a networked-based, e.g., Internet-based, application that may be configured and run on the system 200 and/or any combination of the other components of the system 100. The computer system 200 may include a web server running a Web 2.0 application or the like. Web applications running on system 100 may use server-side dynamic content generation mechanisms such, without limitation, Java servlets, CGI, PHP, or ASP. In certain embodiments, mashed content may be generated by a web browser running, for example, client-side scripting including, without limitation, JavaScript and/or applets on a wireless device.

In certain implementations, system 100 and/or 200 may include applications that employ HDL, VHDL, asynchronous JavaScript+XML (Ajax) and like technologies that use asynchronous loading and content presentation techniques. These techniques may include, without limitation, XHTML and CSS for style presentation, document object model (DOM) API exposed by a web browser, asynchronous data exchange of XML data, and web browser side scripting, e.g., JavaScript. Certain web-based applications and services may utilize web protocols including, without limitation, the services-orientated access protocol (SOAP) and representational state transfer (REST). REST may utilize HTTP with XML.

The systems 100 or 300, computer system 200, or another component of systems 100 or 300 may also provide enhanced security and data encryption. Enhanced security may include access control, biometric authentication, cryptographic authentication, message integrity checking, encryption, digital rights management services, and/or other like security services. The security may include protocols such as IPSEC and IKE. The encryption may include, without limitation, DES, 3DES, AES, RSA, ECC, and any like public key or private key based schemes. Systems 100, 200, and 300 may utilize any of the forgoing encryption algorithms and/or related test vectors to provide known reference output values and/or test vectors, i.e., a software-based golden reference, to compare with outputs from an FPGA DUT implementing such algorithms for FIT.

Figure 3:
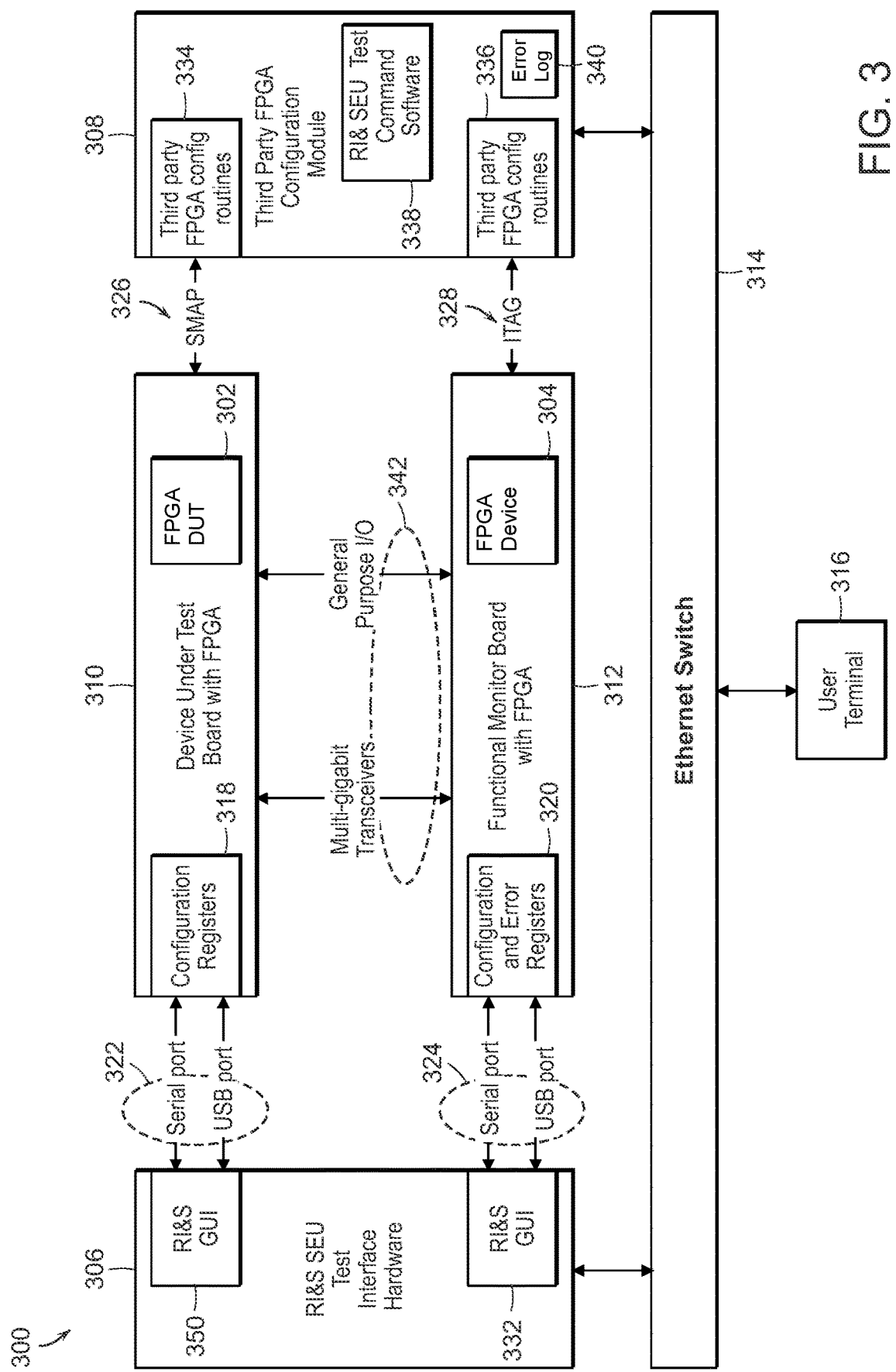
FIG. 3 shows a block diagram of a FIT system configured to interface with an FPGA DUT and reference FPGA device.

FIG. 3 shows a block diagram of a FIT system 300 configured to interface with an FPGA DUT 302 and reference FPGA device 304. FIT system 300 includes a test interface module 306, configuration module 308, a DUT board 310, a monitor module 312, Ethernet switch 314, and user terminal 316. DUT board 310 includes configuration registers 318 and monitor module and/or board 312 includes configuration and error registers 320. Test interface module 306 may include communications interface and/or graphical user interface (GUI) 330 that enables communications with DUT board 320 and/or DUT FPGA 302 via communications link 322. Test interface module 306 may include communications interface 332 that enables communications with monitor module 312 and/or reference FPGA 304 via communications link 324. Configuration module 308 may communicate using a communications interface with DUT board 320 and/or DUT FPGA 302 via communications link 326. Link 326 may use the JTAG and/or SMAP protocol among other commercially available or proprietary protocols. Configuration module 308 may communicate via a communications interface with monitor module 312 and/or reference FPGA 304 via communications link 328. Link 328 may use the JTAG and/or SMAP protocol among other commercially available or proprietary protocols.

Configuration module 308 may include a third party configuration module. Module 308 may include FPGA configuration routines 334 and/or 336 arranged to image CRAM of the FPGA DUT 302 and/or reference FPGA device 304 respectively. Module 308 and/or 306 may include an SEU FIT command function and/or application software 338 arranged to control functions such as, for example, imaging of the FPGA DUT 302, imaging of the reference FPGA device 304, scrubbing of the FPGA DUT 302 and/or reference FPGA device 304, initiation or stopping of SEU injection into FPGA DUT 302, and/or initiation or stopping of operations of the FPGA DUT 302 and/or reference FPGA device 304. Ethernet switch 314 may facilitate communications between test interface module 306, configuration module 308, and/or user terminal 316. Any one or more of the functions performed by test interface module 306, configuration module 308, and/or monitor module 312 according to exemplary system 300 may be performed in whole or in part by any one of modules 306, 308, and 312. Communications link 342 enables data communications between transceivers of FPGA DUT 302 and reference FPGA device 304 including multi-gigabit data transmissions and general purpose input/output (I/O) transmissions.

The test interface module 306 may be arranged to image a CRAM of the FPGA DUT 302, via communications interface 330 and link 322, with a first configuration image to implement a first operational function in the FPGA DUT 302 where the CRAM includes a plurality of CRAM bits. Module 306 may also be arranged to image a CRAM of the reference FPGA device 304, via communications interface 332 and link 324, with the first configuration image to implement the first operational function in the reference FPGA device 304. Module 306 may also log error event data associated with one or more error events stored in one or more error registers 320.

Configuration module 308 includes a communications interface that communicates via link 326 with board 310 and/or FPGA DUT 302. Configuration module 308 is arranged to inject a plurality of single event upsets into a portion of the plurality of the CRAM bits of FPGA DUT 302 while the FPGA DUT 302 is operating based on the first operational function. Monitor module 312 has a communications interface that communicates via link 342 with FPGA DUT 302 and is also in communications with the reference FPGA device 304. FPGA DUT 302 may be mounted on board 310 while reference FPGA device 304 may be mounted on a board of monitor module 312.

Monitor module 312 includes the one or more error registers 320 and is arranged to monitor operations of the FPGA DUT 302 and the reference FPGA device 304 while the FPGA DUT 302 and the reference FPGA device 304 are operating concurrently. Monitor module 312 compares one or more outputs of the FPGA DUT 302 with one or more outputs of the reference FPGA device 304 during concurrent operations. If there is a mismatch between the one or more outputs of the FPGA DUT 302 and the one or more outputs of the reference FPGA 304, monitor module 312 determines that one or more error events have occurred within the FPGA DUT 302 and stores the one or more error events in the one or more error registers 320.

Configuration module 308, which is in electrical communications with test interface module 306 and the monitor module 312, may also be arranged to instruct test interface module 306 to image FPGA DUT 302 and reference FPGA device 304. Configuration module 308 may initiate concurrent operations of FPGA DUT 302 and reference FPGA device 304. Configuration module 308 may instruct monitor module 312 to monitor the concurrent operations of the FPGA DUT 302 and the reference FPGA device 304 while the configuration module 308 injects the plurality of single event upsets into the portion of the plurality of CRAM bits of the FPGA DUT 302. Configuration module 308 may store error event data associated with the one or more error events in an error log 340.

Configuration module 308 may randomly select the portion of the plurality of the CRAM bits where SEUs are injected. Configuration module 308 may select the portion of the plurality of the CRAM bits based on error log data from a previous fault injection test of the FPGA DUT 302. Configuration module 308 may select the portion of the plurality of the CRAM bits based on one or more memory addresses of the CRAM bits associated with error events in the error log 340 of the previous fault injection test of the FPGA DUT 302.

As previously discussed, injecting a single event upset includes changing a logical state of a CRAM bit from a logical 1 to a logical 0 or from a logical 0 to a logical 1. A change in logical state of a CRAM bit corresponds to a change in an electrical state of a CRAM memory element such as, for example, a flip-flop. The error event data may include one or more memory locations of where single event upsets were injected into CRAM. The error log 340 may be stored in a database located in monitor module 312 and/or in configuration module 308.

Configuration module 308 may instruct the test interface module 306 to re-image the CRAM of FPGA DUT 302 with a second configuration image that implements the first operational function of FPGA DUT 302 based on the error log 340 where the second configuration image implements the first operational function of the FPGA DUT 302 while increasing a fault tolerance of the FPGA DUT 302. This may include, for example, adjusting and/or increasing TMR in the image for FPGA DUT 302. Configuration module 308 may also performing scrubbing of FPGA DUT 302 and/or reference FPGA device 304 via test interface module 306 or directly via, for example, communication links 326 and/or 328.

In operation according to one exemplary process, SEU FIT function 338 performs the following:

Commands and/or instructs test interface module 306 via GUIs 330 and 332 to configure and/or image the FPGAs 302 and 304.

Commands test interface module 306 GUI 332 to start logging error register 320 contents.

Commands configuration module 308, via FPGA routines 334, to inject (then correct) CRAM errors in FPGA DUT 302. Correction may include scrubbing based on, without limitation, blind scrubbing, CRC-based scrubbing, Frame ECC-based scrubbing, and/or SECDED scrubbing.

Commands FPGA routines 334 to stop injection/correction process.

Commands test interface module 306 GUI 332 to stop logging error register 320 contents.

Such a process advantageously coordinates steps of the FIT to run quickly and without human intervention, making it scalable to work on large complex flight images which require a large amount of data. Conventional fault injection approaches have required complex human intervention and decision making between fault injection routines and functional monitoring which has not been scalable to large complex designs. In contrast, the inventive FIT described herein includes decision algorithms that automate FIT process. Conventional particle beam approaches have required major engineering work between runs as well as significant cost and scheduling associated with using the beam facility. Furthermore, conventional particle beam approaches generate noisy data from which it is difficult to extract accurate error rates, which can result in over-design with excessive TMR that can waste otherwise usable space on an FPGA device.

System 300 includes a configuration capable of performing an upset measurement method where errors are identified by comparing FPGA DUT 302 results to a golden copy running in lockstep on a separate FPGA, e.g., reference FPGA device 304, while recording mis-compares or mismatches in error registers 320. In some implementations, system 300 does not have to run the FPGA DUT 302 and reference FPGA 304 in lockstep. System 300 can buffer the results from either the FPGA DUT 302 or reference FPGA 304 and find the correct starting point for the comparison between the outputs of the FPGA DUT 302 and reference FPGA 304. Regardless of whether lockstep or buffering comparisons are performed, system 300 may monitor concurrent operations of the FPGA DUT 302 and reference FPGA 304 to compare their outputs from a particular starting point. Test interface module 306 GUI 332 reads error registers 320 on monitor module 312 and/or reference FPGA device 304 via any protocol (e.g., I2C, UART, and/or custom) which enables test interface module 306 to be used with any hardware setup. This flexibility facilitates executing a FIT experiment on any hardware setup including flight hardware and engineering models. This approach is extensible to complex hardware setups that facilitates efficient testing of complex flight designs. Conventional FIT methods are limited to run on specific hardware with few I/O options, limiting the types of designs that may be tested. Furthermore, conventional methods compare outputs to expected results from software simulation limiting its use to smaller designs.

System 300 also includes a configuration capable of performing a cause and effect determination method where the FIT test randomly selects CRAM bits into which it inserts upsets. Those upset locations are stored in a log file, e.g., error log 340, enabling the ability to then execute a FIT test targeting specific upset locations identified from the previous random test. This feature enables the ability to map specific upset locations to any observed design level upset which greatly enhancing design debugging. The coordination of the error logging portion of a FIT experiment and the fault injection portion of the FIT experiment makes it easy to replicate results for targeted debug of any design level upset of interest. Conventional approaches do not have the coordination of fault injection locations and design level error logging making this sort of cause and effect analysis extremely difficult.

FIG. 4 shows a FPGA fault testing process table 400 including a comparison of FIT in column 422 to beam testing in column 424. Testing hardware is initially setup, e.g. hardware included in system 300 (Step 402). Then, the FPGA DUT, e.g., FPGA DUT 302, is imaged or re-imaged (Step 404). A function test is initiated (Step 406). Scrubbing is initiated (Step 408). Error logging is initiated (Step 410). Then, SEUs are injected into the CRAM of FPGA DUT (Step 412). After a pre-determined fluence, error injection is stopped (Step 414). Error logging is stopped (Step 416). Scrubbing is stopped (Step 418). Then, the process is repeated by going to Step 404. Steps 402, 404, 406, 408, 410, 416, 418, and 420 are the same between FIT and heavy ion beam testing. But, in Step 412, FIT includes writing erroneous values to random CRAM bits using a fixed flux while CRAM is the only source of upsets (See Column 422). In contrast, heavy ion beam testing in Step 412 involves exposing a FPGA DUT to a variable flux that can potentially affecting any FPGA elements and/or primitives which could be sources of upsets, not just CRAM bits. In step 414, both FIT and heavy ion beam testing produce similar amount of data.

Figure 5:
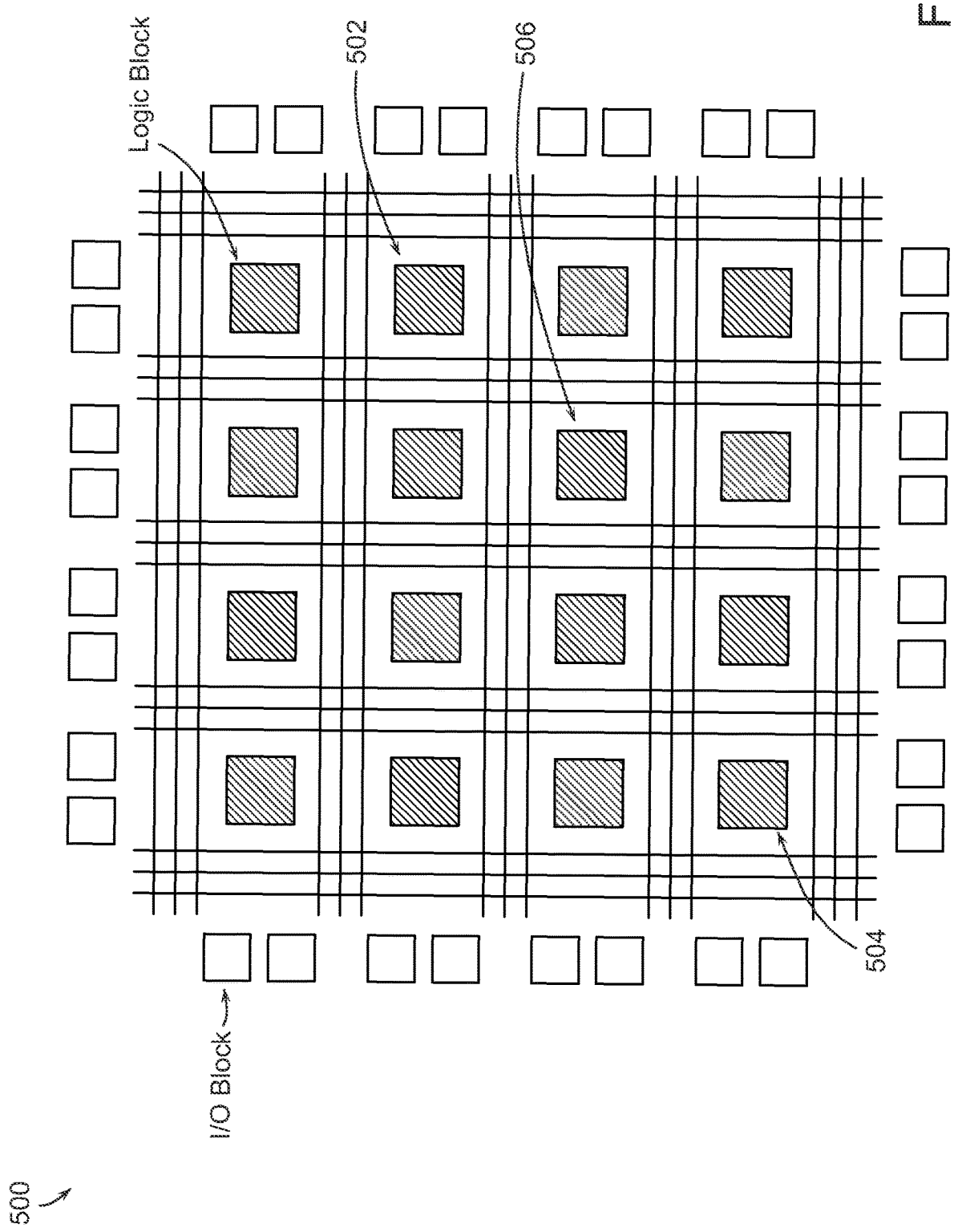
FIG. 5 shows a block diagram of a FPGA device and/or chip including an exemplary layout of CRAM.

FIG. 5 shows a block diagram of a FPGA device and/or chip 500 including an exemplary layout of CRAM and/or logical blocks. FIG. 5 illustrates how difficult and/or impractical it is to precisely determine the source of upsets within an FPGA device 500 using heavy ion beam testing as the beam could affect primitives within any of, for example, logic blocks 502, 504, and 506. In contrast, FIT enables very granular and specific targeting of particular CRAM bits in any one of or all of logic blocks 502, 504, and 506.

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Other implementations not specifically described in this specification are also within the scope of the following claims.

What is claimed is:

1. A fault injection test system for field programmable gate array (FPGA) devices comprising:
   a test interface module including a first communications interface for a FPGA device under test (DUT) and a second communications interface for a reference FPGA device, the test interface module being arranged to:
      image a configuration RAM (CRAM) of the FPGA DUT, via the first communications interface, with a first configuration image to implement a first operational function in the FPGA DUT, the CRAM including a plurality of CRAM bits,
      image a CRAM of the reference FPGA device, via the second communications interface, with the first configuration image to implement the first operational function in the reference FPGA device, and
      log error event data associated with one or more error events stored in one or more error registers;
   a configuration module including a third communications interface to the FPGA DUT, the configuration module arranged to inject a plurality of single event upsets into a portion of the plurality of the CRAM bits while the FPGA DUT is operating based on the first operational function; and a monitor module including a fourth communications interface for the FPGA DUT and in communications with the reference FPGA device, the monitor module including the one or more error registers, the monitor module arranged to:
  monitor operations of the FPGA DUT and the reference FPGA device while the FPGA DUT and the reference FPGA devices are operating concurrently,
  compare one or more outputs of the FPGA DUT with one or more outputs of the reference FPGA device during concurrent operations, and
  when there is a mismatch between the one or more outputs of the FPGA DUT and the one or more outputs of the reference FPGA, determine that the one or more error events have occurred within the FPGA DUT and store the one or more error events in the one or more error registers; and
the configuration module in communication with the test interface module and the monitor module being further arranged to:
  instruct the test interface module to image the FPGA DUT and reference FPGA device and initiate concurrent operations of the FPGA DUT and the reference FPGA device,
  instruct the monitor module to monitor the concurrent operations of the FPGA DUT and the reference FPGA device while the configuration module injects the plurality of single event upsets into the portion of the plurality of CRAM bits of the FPGA DUT, and
  store the error event data associated with the one or more error events in an error log.

2. The system of claim 1, wherein the configuration module randomly selects the portion of the plurality of the CRAM bits.

3. The system of claim 1, wherein the configuration module selects the portion of the plurality of the CRAM bits based on an error log from a previous fault injection test of the FPGA DUT.

4. The system of claim 3, wherein the configuration module selects the portion of the plurality of the CRAM bits based on one or more memory addresses of the CRAM bits associated with error events in the error log of the previous fault injection test of the FPGA DUT.

5. The system of claim 1, wherein injecting a single event upset of the plurality of single event upsets includes changing a logical state of a CRAM bit from a logical 1 to a logical 0 or from a logical 0 to a logical 1.

6. The system of claim 5, wherein a change in logical state of a CRAM bit corresponds to a change in an electrical state of a CRAM memory element.

7. The system of claim 1, wherein the error event data includes one or more memory locations of where single event upsets that were injected into CRAM.

8. The system of claim 1, wherein the error log is stored in a database located in at least one of the monitor module and the configuration module.

9. The system of claim 1, wherein the configuration module instructs the test interface module to re-image the CRAM of the FPGA DUT with a second configuration image that implements the first operational function of the FPGA DUT based on the error log.

10. The system of claim 9, wherein the second configuration image implements the first operational function of the FPGA DUT while increasing a fault tolerance of the FPGA DUT.

11. A method for performing fault injection testing for field programmable gate array (FPGA) devices comprising:
  interfacing, via a first communications interface, with a FPGA device under test (DUT);
  imaging a configuration RAM (CRAM) of the FPGA DUT with a first configuration image to define a first operational function of the FPGA DUT, the CRAM including a plurality of CRAM bits;
  injecting a plurality of single event upsets into a portion of the plurality of the CRAM bits while the FPGA DUT is operating based on the operational function;
  monitoring, via a second communications interface, operations of the FPGA DUT;
  monitoring concurrently with monitoring the operations of the FPGA DUT, via a third communications interface, operations of a reference FPGA device, wherein a CRAM of the reference FPGA device is configured with the first configuration image and operating based on the first operational function;
  comparing one or more outputs of the FPGA DUT with one or more outputs of the reference FPGA device during concurrent operations,
  when there is a mismatch between the one or more outputs of the FPGA DUT and the one or more outputs of the reference FPGA, determining that one or more error events have occurred within the FPGA DUT; and
  in response to determining that the one or more error events have occurred within the FPGA DUT, storing at least one of the one or more error events and CRAM location data associated with corresponding single event upsets in an error log.

12. The method of claim 11 comprising randomly selecting the portion of the plurality of the CRAM bits.

13. The method of claim 11 comprising selecting the portion of the plurality of the CRAM bits based on an error log from a previous fault injection test of the FPGA DUT.

14. The method of claim 13 comprising injecting the selected plurality of single event upsets into the portion of the plurality of CRAM bits of the FPGA DUT while the FPGA DUT is operating.

15. The method of claim 11, wherein injecting a single event upset of the plurality of single event upsets includes changing a logical state of a CRAM bit from a logical 1 to a logical 0 or from a logical 0 to a logical 1.

16. The method of claim 15, wherein a change in logical state of a CRAM bit corresponds to a change in an electrical state of a CRAM memory element.

17. The method of claim 11, wherein the error log includes at least one of a register and a database.

18. The method of claim 17, wherein the at least one of the register and the database are located in a monitor module and a configuration module.

19. The method of claim 11 comprising re-imaging the CRAM of the FPGA DUT with a second configuration image that implements the first operational function of the FPGA DUT based on the error log, wherein the second configuration image implements the first operational function of the FPGA DUT while increasing a fault tolerance of the FPGA DUT.

20. A method for performing fault injection testing for field programmable gate array (FPGA) devices comprising:
  interfacing with a FPGA device under test (DUT);
  imaging a configuration RAM (CRAM) of the FPGA DUT with a first configuration image to define a first operational function of the FPGA DUT, the CRAM including a plurality of CRAM bits, injecting a first plurality of single event upsets into randomly-selected portions of the plurality of the CRAM bits while the FPGA DUT is operating based on the operational function;

monitoring operations of the FPGA DUT;

comparing one or more outputs of the FPGA DUT with one or more known reference outputs;

when there is a mismatch between the one or more outputs of the FPGA DUT and the one or more known reference outputs, determining that one or more error events have occurred within the FPGA DUT;

in response to determining that the one or more error events have occurred within the FPGA DUT, storing at least one of the one or more error events and CRAM location data associated with corresponding first single event upsets in an error log; and injecting a second plurality of single event upsets into one or more portions of the plurality of the CRAM bits based on the CRAM location data associated with the corresponding first randomly-selected single event upsets in the error log while the FPGA DUT is operating based on the operational function.

\* \* \* \* \*